United States Patent
Neo et al.

(10) Patent No.: US 8,129,278 B2
(45) Date of Patent: Mar. 6, 2012

(54) CHEMICAL MECHANICAL POLISHING PROCESS

(75) Inventors: Boon-Tiong Neo, Singapore (SG);
Chin-Kun Lin, Kao-Hsiung (TW);
Lee-Lee Lau, Melaka (MY)

(73) Assignee: United Microelectronics Corp.,
Science-Based Industrial Park, Hsin-Chu (TW)

( * ) Notice: Subject to any disclaimer, the term of this patent is extended or adjusted under 35 U.S.C. 154(b) by 1265 days.

(21) Appl. No.: 11/164,204

(22) Filed: Nov. 14, 2005

(65) Prior Publication Data

US 2007/0111517 A1    May 17, 2007

(51) Int. Cl.
*H01L 21/302* (2006.01)

(52) U.S. Cl. ........ 438/692; 438/626; 438/645; 438/693; 257/E21.304; 257/E21.23

(58) Field of Classification Search .................. 438/626, 438/645, 648, 692, 693; 257/E21.23, E21.304; 216/52

See application file for complete search history.

(56) References Cited

U.S. PATENT DOCUMENTS

| 6,001,730 | A | 12/1999 | Farkas |
| 6,736,701 | B1 * | 5/2004 | Shue et al. ........................ 451/8 |
| 7,022,255 | B2 * | 4/2006 | Siddiqui et al. .............. 252/79.1 |
| 7,104,869 | B2 * | 9/2006 | Tsai et al. ........................ 451/41 |
| 2002/0077036 | A1 * | 6/2002 | Roberts et al. .................. 451/41 |
| 2002/0182986 | A1 * | 12/2002 | Tung et al. ....................... 451/56 |
| 2005/0275135 | A1 * | 12/2005 | David et al. ................... 264/259 |
| 2005/0282380 | A1 * | 12/2005 | Tsai et al. ........................ 438/626 |
| 2006/0046490 | A1 * | 3/2006 | Banerjee et al. .............. 438/692 |
| 2006/0219663 | A1 * | 10/2006 | Wang et al. ..................... 216/88 |

* cited by examiner

*Primary Examiner* — Julio J Maldonado

(74) *Attorney, Agent, or Firm* — Winston Hsu; Scott Margo

(57) ABSTRACT

A copper/barrier CMP process includes (a) providing a substrate having a bulk metal layer and a barrier layer; (b) polishing the substrate with a first hard polishing pad on a first platen to substantially remove an upper portion of the bulk metal layer, wherein the first hard polishing pad has a hardness of above 50 (Shore D); (c) polishing the substrate with a second hard polishing pad on a second platen to remove residual copper, thereby exposing the barrier layer, wherein the second hard polishing pad has a hardness of above 50 (Shore D); and (d) polishing the substrate with a third hard polishing pad on a third platen to remove the barrier layer, wherein the third hard polishing pad has a hardness ranging between 40-50 (Shore D).

46 Claims, 4 Drawing Sheets

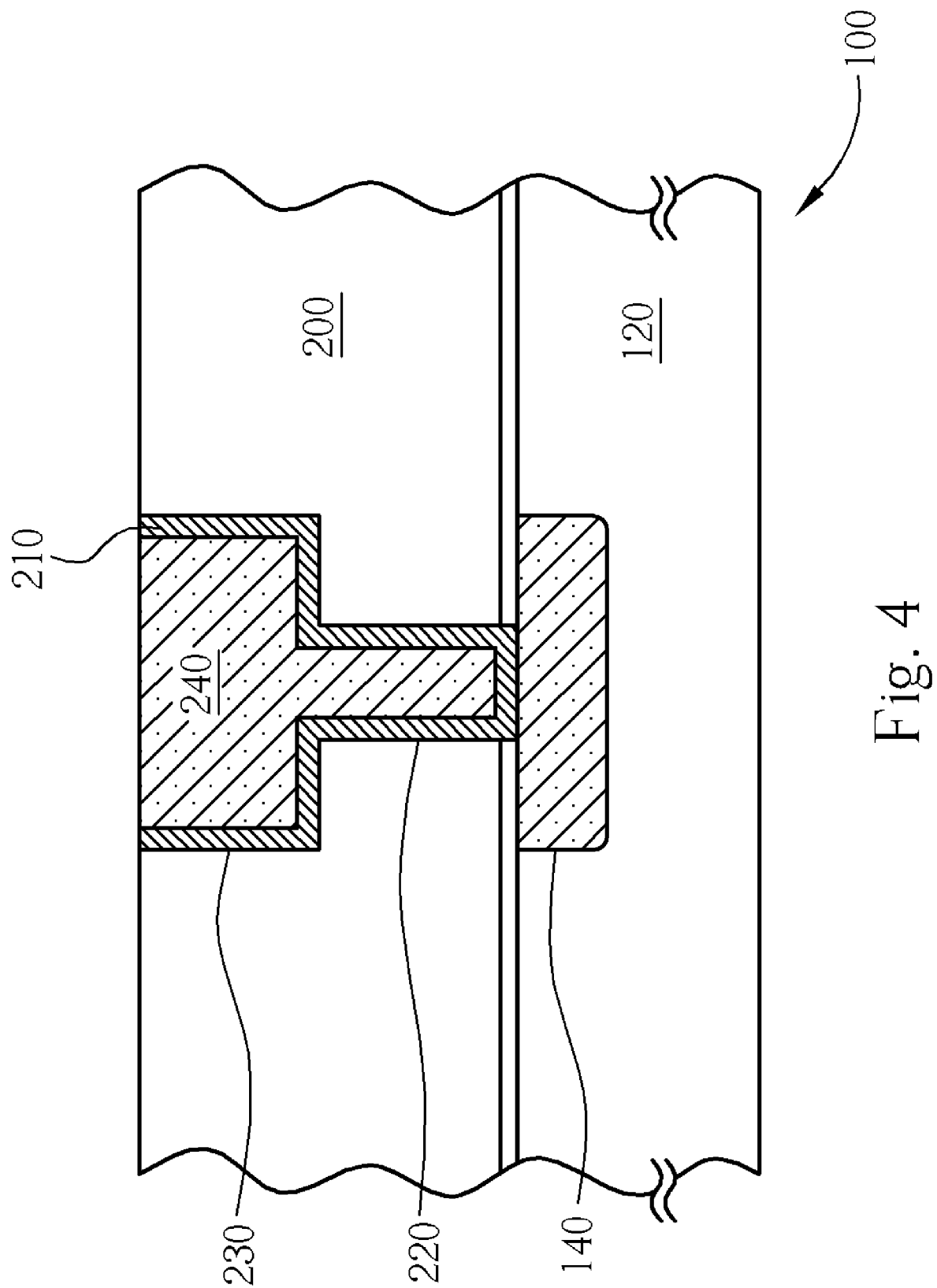

CHEMICAL MECHANICAL POLISHING PROCESS

BACKGROUND OF THE INVENTION

1. Field of the Invention

The present invention relates to the field of semiconductor fabrication, and more particularly, to chemical mechanical polishing and planarization of semiconductor devices.

2. Description of the Prior Art

The increasing need to form planar surfaces on a variety of materials has led to the development of process technology known as chemical mechanical polishing (CMP). The CMP method typically requires that the substrate be mounted on a carrier or polishing head. The exposed surface of the substrate is placed against a rotating polishing pad. The polishing pad may be either a "standard" pad or a fixed-abrasive pad. A fixed-abrasive pad has abrasive particles held in a containment media, whereas a standard pad has a durable surface, without embedded abrasive particles. The carrier head provides a controllable load, i.e., pressure, on the substrate to push it against the polishing pad. Polishing slurry, including at least one chemically reactive agent, and abrasive particles if a standard pad is used, is supplied to the surface of the polishing pad.

The polishing process is assisted by chemical compounds within the polishing slurry that facilitate removal of the material being polished. By carefully selecting the chemical components of the polishing slurry, the polishing process can be made more selective to one type of material than to another. The ability to control the selectivity of a CMP process has led to its increased use for delicate surface applications, such as the fabrication of complex integrated circuits.

A common requirement of all CMP processes is that the substrate be uniformly polished and that the amount of material removed by the polishing process be controlled in a repeatable fashion. Optical techniques have been developed to monitor the polishing process and to determine a process end-point. Typically, the optical end-point detection method involves generating a light beam and reflecting the light beam off of the surface being polished. Because both the surface being polished and the polishing pad are in continuous motion during the polishing process, it is difficult to construct an optical pathway for continuous light transmission.

Polishing pads are typically composed of two or more overlying layers of different materials. Typically, a polishing pad includes at least a polishing layer overlying a backing layer. Additionally, an adhesive layer is commonly used to adhere the backing layer to the polishing platen. Since the polishing layer and the backing layer are typically composed of different materials, the optical transparency of the materials also differs. Most materials used as a polishing layer are opaque to light over a wavelength range useful for end-point detection. Many of the materials used to construct a backing layer, however, are transparent to light. Accordingly, polishing pads have been fabricated in which sections of the polishing layer are removed and replaced with an optically transparent material to form an end-point detection window.

Copper damascene or copper dual damascene technique combined with copper/barrier CMP are known in the art. In a conventional copper dual damascene process, a dielectric layer is deposited onto a substrate, patterned, and etched back such that trenches, vias, and other recessed regions etched into the dielectric layer represent the desired metal interconnection pattern. Barriers and copper are then sequentially deposited/sputtered over the entire surface of the device, filling the recessed regions and blanketing the surface of the dielectric layer. The bulk copper layer and barrier layer are then polished back to a degree such that the Cu/barrier structure becomes electrically isolated within the recessed regions etched out of the dielectric material.

A typical copper/barrier CMP method includes the steps of (1) polishing the bulk copper layer using a first platen containing a hard polishing pad such as IC series pads (ex. IC 1000 or IC 1010) available from Rodel Inc.; and (2) removing the barrier layer using a second platen containing a soft polishing pad such as Politex. The Politex soft pad, which is prevalent in the semiconductor industry for the barrier CMP, is a poromeric pad having a hardness of about 60 (Shore A) and a compressibility of about 4.2%-18%. It is noted that the Politex soft pad has no end-point detection window. Ordinarily, during the polishing of the barrier layer, no condition chemicals are dispersed on the Politex soft pad. The conditioning of the Politex soft pad is usually performed by means of a brushing tool, which is different from the way of conditioning for the hard IC series pads. The conditioning of the hard IC series pads is typically performed with a diamond disk in combination with condition chemicals dispersed on the pads.

However, the above-described prior art copper/barrier CMP utilizing a soft pad for barrier polishing has some drawbacks. First, the lifetime of the Politex soft pad applicable for the barrier CMP is very short (~10 hours). Frequent change of the Politex soft pad on the second platen adversely affects the tool uptime and product throughput. Second, when using the Politex soft pad on the third platen, the removal rate of the barrier layer is unstable and the uniformity is not satisfactory. The unstable removal rate and poor uniformity due to the use of the Politex soft pad deteriorate as the pad is near the end of its lifetime.

In light of the foregoing, there is a constant need in this industry to provide an improved copper/barrier CMP process with sufficient reliability, increased throughput and relatively low cost.

SUMMARY OF THE INVENTION

It is therefore a primary objective of the present invention to provide an improved copper/barrier CMP process to solve the above-described prior art problems.

According to the claimed invention, in one aspect, a copper/barrier chemical mechanical polishing (CMP) process is disclosed. The copper/barrier CMP process includes (a) providing a substrate having a bulk metal layer and a barrier layer; (b) polishing the substrate with a first hard polishing pad on a first platen to substantially remove an upper portion of the bulk metal layer, wherein the first hard polishing pad has a hardness of above 50 (Shore D); (c) polishing the substrate with a second hard polishing pad on a second platen to remove residual copper, thereby exposing the barrier layer, wherein the second hard polishing pad has a hardness of above 50 (Shore D); and (d) polishing the substrate with a third hard polishing pad on a third platen to remove the barrier layer, wherein the third hard polishing pad has a hardness ranging between 40-50 (Shore D).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 4 demonstrates a schematic cross-sectional view of the substrate after implementing barrier polishing according to this invention.

DETAILED DESCRIPTION

The present invention is directed to a method of forming reliable interconnects of integrated circuits, more specifically to a copper/barrier chemical mechanical polishing process applied during the back end fabrication of integrated circuits with inlaid copper interconnects. In general, aspects of the invention provide methods for planarizing a substrate surface using multiple hard polishing pads while minimizing scratching and defects of the substrate surface.

The invention will be described below in reference to a planarizing process for the removal of conductive materials, such as copper containing materials, and barrier layer materials, such as tantalum and tantalum nitride, from a substrate surface by chemical mechanical polishing (CMP) techniques with hard polishing pads.

It is to be understood that the term "copper layer" used hereinafter means copper or any suitable copper alloys known in the art unless otherwise indicated. The advantages of this invention at least include an improved throughput, wafer variation, and relatively lower cost at the stage of CMP.

Figure 1:
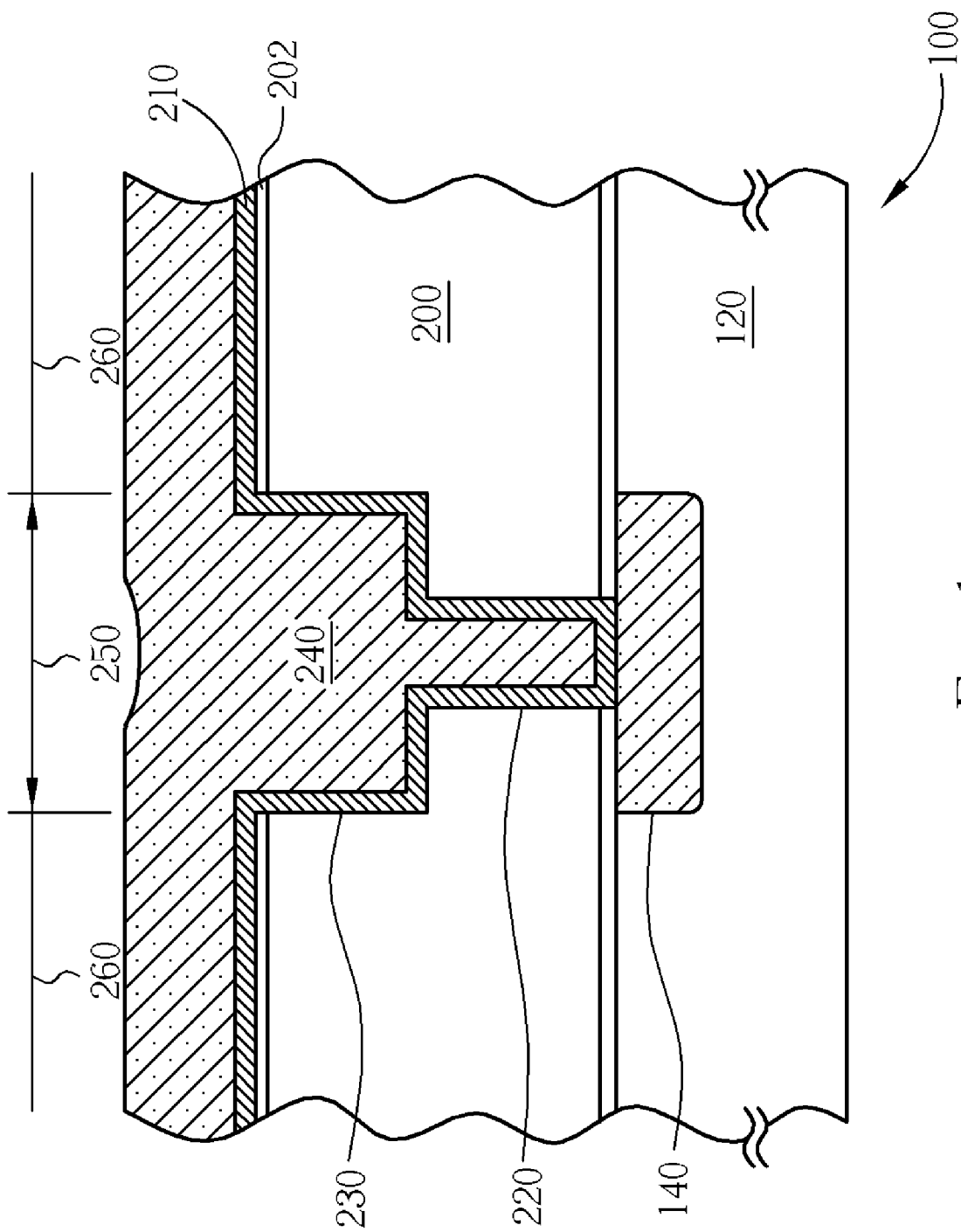
FIG. 1 is a schematic cross-sectional diagram showing a semiconductor substrate having a top bulk copper layer and a lower barrier layer.

For the purpose of explanation, referring initially to FIG. 1, a cross section of a semiconductor substrate or wafer 100 provided thereon a top bulk copper layer 240 and a lower barrier layer 210 prior to the performance of the present invention CMP method is demonstrated.

As shown in FIG. 1, the barrier layer 210 is formed on the interior surface of a recessed damascene region 250 and on the uppermost surface areas 260 of the dielectric layer 200. Examples of the barrier layer 210 include tantalum, tantalum nitride, titanium, titanium nitride, nickel nitride or the like. The dielectric layer 200 may comprise any suitable low-k dielectrics (k: dielectric constant<3) known in the art, and a layer of capping material 202 laminated at the top. The capping material 202 may be silicon carbide or silicon nitride, but not limited thereto.

The recessed damascene region 250 includes but not limited to a trench 230 and via 220 communicating with the trench 230. In another case, a single damascene structure such as a single via or single trench may apply. The openings are formed in interlayer dielectrics by conventional photolithographic and etching techniques. Via 220 communicates with an underlying device 140 that is insulated by the dielectric layer 120. The underlying device 140 may be a metal interconnect. In another embodiment, the underlying device 140 may be, for example, a poly gate of a MOS device or a diffusion region implanted into a semiconductor body.

Figure 2:
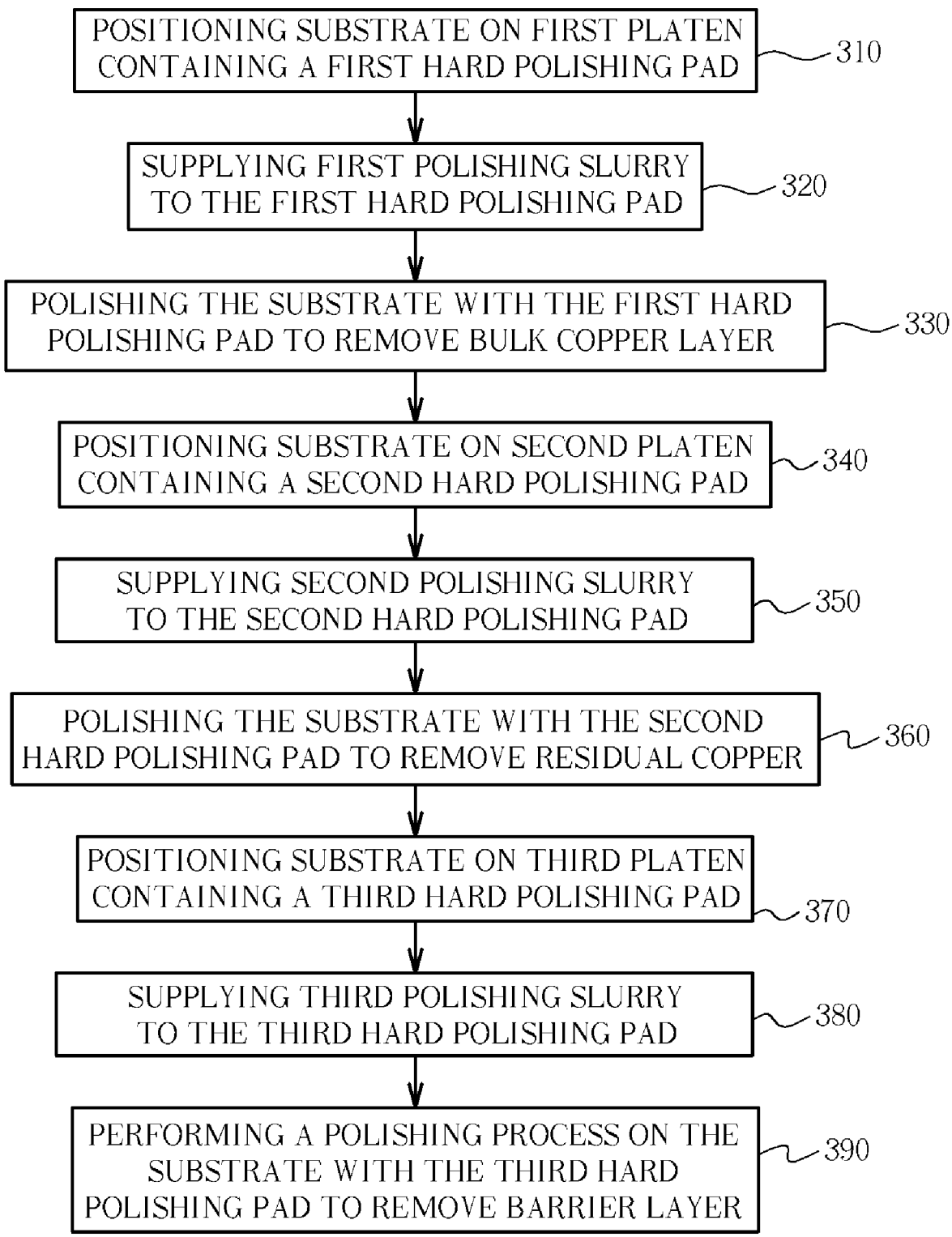
FIG. 2 is a flow chart showing the copper/barrier CMP process in a three-step planarization process using three hard polishing pads according to one preferred embodiment of this invention.

Please refer to FIG. 2 and briefly back to FIG. 1. FIG. 2 is a flow chart showing the copper/barrier CMP process in a three-step planarization process using three hard polishing pads according to one preferred embodiment of this invention. The CMP tool described in the embodiments may be a Mirra CMP system available from Applied Materials, Inc., though, any system enabling polishing using the methods described herein can be used to advantage. In accordance with present invention, the bulk copper layer 240 is not removed or buffed off in one single step, but in two steps with two succeeding platens for reliability concerns.

According to one preferred embodiment of the present invention, the preferable CMP tool is equipped with three rotatable platens. Each platen may be a rotatable aluminum or stainless steel platen connected to a platen drive motor (not shown). The first two platens are used to polish copper layer 240, while the third platen is used to polish barrier layer 210.

As shown in FIG. 2, in Step 310, the substrate 100 is positioned on the first platen containing a first hard polishing pad. The first hard polishing pad may be IC 1000 or IC 1010 pads available from Radel, Inc., Phoenix Ariz., with a compressibility of about 0.5%-4% and a hardness of about 52-62 on the Shore D Hardness scale for polymeric materials measured by the American Society for Testing and Materials (ASTM). The first hard polishing pad may have a durable roughened surface composed of microporous polyurethane or polyurethane mixed with filler. In some cases, the hard polishing pad may comprise felt impregnated with polyurethane.

In Step 320, first polishing slurry is then supplied to the first polishing pad. An upper portion of the bulk copper layer 240 is then removed from the surface of the substrate 100 by polishing the substrate at Step 330. The first slurry may be alumina-based slurry or silica-based slurry. Preferably, the first slurry has a "copper to barrier selectivity" that is greater than 30, more preferably greater than 100. Copper to barrier selectivity is defined as a ratio of the removal rate of copper to that of barrier. The presence of triazole or triazole derivatives in the CMP slurry has been experimentally shown to reduce dishing or recessing of the copper interconnect.

Examples of suitable first polishing slurry, including abrasive-containing polishing compositions and abrasive-free polishing compositions, commercially available for removing copper layer in the first polishing step on a hard polishing pad include Eterpol EPL 2361, EPL 2362, EPL 1405, EPL 1453, EPL 2315, available from Eternal Chemical Company Ltd., Taiwan; EPC-5001 and EPC-5306, available from Cabot Corp.; Copper S1 3116, Copper S1 3280, and Copper S1 3125, available from Rodel Inc., of Newark, Del.; Microplanar CMP9000, CMP9003, and CMP9011, available from EKC Technology Inc., Hayward Calif.

The hard polishing pad is moved relative to the substrate with the first polishing slurry distributed therebetween to effect chemical and mechanical activity on the substrate. Relative movement is provided between the substrate and polishing pad by rotating the carrier head and platen each at a rate between about 50-150 rpm.

The first polishing slurry is delivered or supplied to the first hard polishing pad at a flow rate between about 30-500 ml/min from a storage medium disposed in or near the CMP apparatus. A pressure between about 1.5-8.0 psi, preferably between about 2-6 psi, between the substrate and the polishing pad is used to provide mechanical activity to the polishing process.

The remaining bulk copper layer 240 not removed in the above process (Steps 310-330) may remain as residual copper material on the substrate surface. The residual copper material may comprise copper, copper oxide (CuO), and combinations thereof.

A subsequent wafer rinse process is optionally performed in order to avoid cross contamination between two succeeding platens. Upon removal from the first platen, the substrate or wafer 100 may be rinsed with deionized water or any suitable wet cleaning chemistry when in transfer between the first platen and the second platen.

In Step 340, the substrate 100 is then positioned on a second platen containing a second hard polishing pad. The second hard polishing pad may be IC 1000, IC 1010 or Suba series pads available from Radel, Inc., Phoenix Ariz., with a compressibility of about 0.5%-4.0% and a hardness of about 52-62 (Shore D). The hard polishing pad may have a durable roughened surface typically composed of microporous polyurethane or polyurethane mixed with filler. In some cases, the hard polishing pad may have felt impregnated with polyurethane.

The second hard polishing pad has thereon a transparent end-point detection window. An optical end-point detection means installed under the second platen generates a light beam and reflecting the light beam off of the surface being polished. As previously mentioned, optical techniques have been developed to monitor the polishing process and to determine a process end-point. A stationary light source is positioned in proximity to the platen and opposite to the side of the platen supporting the polishing pad. As the opening in the platen and corresponding aperture in the polishing pad pass over the light source, the light beam emitted by the light source is momentarily reflected by the surface being polished. The reflected optical signals are collected by a detector over time and electrically analyzed to determine a polishing end-point.

Figure 3:
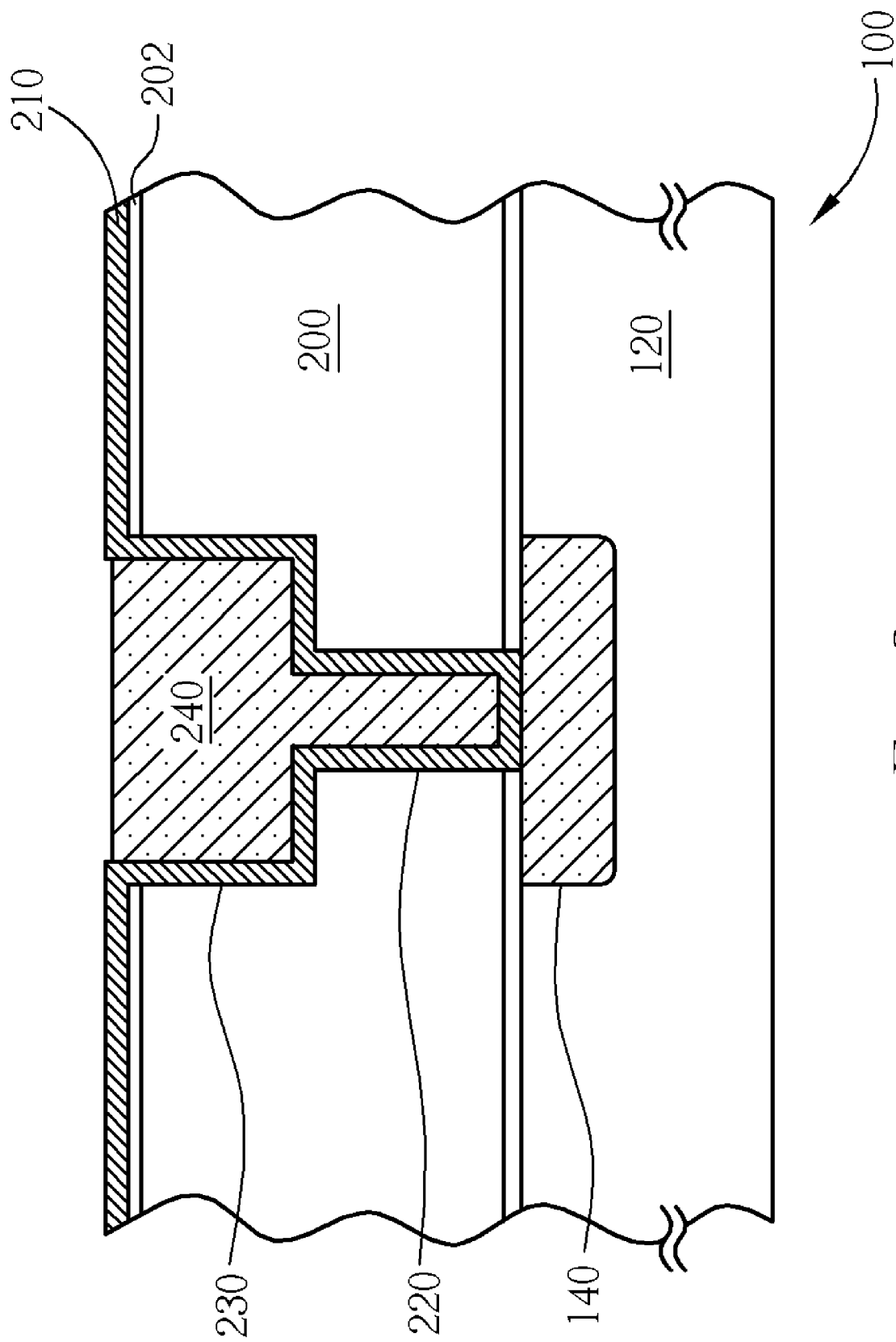
FIG. 3 demonstrates a schematic cross-sectional view of the substrate after implementing two-step copper polishing according to this invention.

In Step 350, second polishing slurry is supplied to the second polishing pad. Residual copper containing materials are then removed from the surface of the substrate by polishing the substrate at Step 360. FIG. 3 demonstrates a schematic cross-sectional view of the substrate 100 after the polishing step 360. The top bulk copper layer 240 and residual copper on the barrier layer 210 are removed. The second step of the two-step copper CMP effectively stops on the tantalum-based barrier layer 210. It has been observed that the two-step copper polishing process described above with hard polishing pads reduces dishing of the copper containing material and reduces the formation of scratches on the substrate surface during chemical mechanical polishing of the substrate surface.

The second polishing slurry may be used with a second hard polishing pad in a second polishing step to remove residual copper containing material from the substrate. The second polishing slurry suitable for polishing residual copper containing material includes at least one or more chelating agents. The compositions may also contain abrasive particles.

Examples of suitable second polishing slurry, including abrasive-containing polishing compositions and abrasive-free polishing compositions, commercially available for removing residual copper material in the second polishing step on a hard polishing pad include EPC-5003, EPC-5001, and EPC-5306, available from Cabot Corp.; Copper S1 3116, Copper S1 3280, and Copper S1 3125, available from Rodel Inc., of Newark, Del., HC-430-A1-3, HS-A3, HS-C435, and HS-A2, available from Hitachi Chemical Corp., Japan, Microplanar CMP9000, CMP9003, and CMP9011, available from EKC Technology Inc., of Hayward Calif., Eterpol EPL 2352, EPL 2311, EPL 1405, EPL 1453, EPL 2315, EPL 2313, and Eterpol 765057, available from Eternal Chemical Company Ltd., Taiwan, DP-191 and DP-200, available from Dupont Chemical of Wilmington, Del.

In Step 370, the substrate 100 as seen in FIG. 3 is then positioned on a third platen containing a third hard polishing pad. It is a salient feature of the present invention that the third polishing pad, i.e., the barrier removal polishing pad, installed on the third platen of the CMP tool is a "hard" pad, rather than a "soft" pad.

Specifically, the third hard polishing pad has a hardness of about 40-50 (Shore D), preferably 42.5-49.5 (Shore D). The third hard polishing pad may be VP 3100 with SP 2310 backing layer both available from Radel, Inc., Phoenix Ariz. and has a compressibility of about 0.5%-4.0%. The third polishing pad has thereon a transparent window for thickness monitoring. The third polishing pad has thereon a pattern of grooves (K-XY groove pattern). It is one feature that the third polishing pad has thereon a strip of non-groove area enclosing the transparent window on the polishing surface to improve uniformity.

It is another feature that the third platen is connected to a NOVA™ thickness measurement system that is capable of implementing close-loop control in the CMP tool. The lifetime of the third hard pad can be monitored by the NOVA™ thickness measurement system. It is experimentally shown that the lifetime of such third hard polishing pad exceeds 80 hours, and the process performance is improved.

The range of the hardness of the third hard polishing pad is critical because it is experimentally shown that increased scratch defects are found on the surface of the substrate when a polishing pad having a hardness of above 50 (Shore D) is employed at Steps 370-390. It is also found that wafer uniformity becomes poor when a polishing pad having a hardness of below 40 (Shore D) is employed at Steps 370-390.

In Step 380, a barrier removal polishing composition is then supplied to the third hard polishing pad. According to the preferred embodiment of this invention, the barrier removal polishing composition is an alkaline, abrasive-containing composition. It is one feature of this invention that the CMP tool comprises a conditioning system including a diamond disk installed near the third platen for periodically in-stu conditioning or rejuvenating the polishing surface of the third hard polishing pad with the use of alkaline condition chemicals such as ESC 794 available from ATMI; and EPL 8151, available from Eternal Chemical Company Ltd., Taiwan, wherein EPL 8151 contains triethanolamine, ethylene glycol, piperazine ($C_4H_{10}N_2$), and citric acid, preferably with a pH of 9.0 to 11.0. The step of periodic conditioning the third hard polishing pad by using the diamond disk and the abovementioned condition chemicals is important to increase the lifetime of the pad.

The barrier layer 210 is then removed from the surface of the substrate 100 by a polishing process on the substrate at Step 390. The barrier layer 210 may be removed at a rate of about 500-2000 angstroms/min. FIG. 4 demonstrates a schematic cross-sectional view of the substrate 100 after the polishing step 390. The barrier CMP effectively stops on the tantalum-based barrier layer 210.

While the foregoing is directed to one or more embodiments of the invention, other and further embodiments of the invention may be devised without departing from the basic scope thereof, and the scope thereof is determined by the claims that follow including their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chemical mechanical polishing process, comprising:
   placing a substrate on a first hard polishing pad of a first platen, wherein the substrate has a bulk metal layer and a barrier layer;
   polishing the bulk metal layer by using the first hard polishing pad having a hardness of above 50 (Shore D) until the barrier layer is exposed;
   after removing the bulk metal layer, placing the substrate on a second hard polishing pad of a second platen, wherein the second hard polishing pad has a hardness ranging between 40-50 (Shore D) and comprises an upper layer and a lower backing layer and said upper layer has a hardness less than 50 (Shore D);
   dispersing an alkaline condition chemical onto the second hard polishing pad; and
   polishing the barrier layer by using the second hard polishing pad.

2. The chemical mechanical polishing process according to claim 1 wherein the second hard polishing pad has a compressibility of about 0.5%-4.0%.

3. The chemical mechanical polishing process according to claim 1 wherein the chemical mechanical polishing process further comprising the following step:
   periodically rejuvenating a polishing surface of a third hard polishing pad using a conditioning diamond disk.

4. The chemical mechanical polishing process according to claim 1 wherein the alkaline condition chemical comprise triethanolamine, ethylene glycol, piperazine (C4H10N2), and citric acid.

5. The chemical mechanical polishing process according to claim 1 wherein the alkaline condition chemical has a pH of about 9.0-11.0.

6. The chemical mechanical polishing process according to claim 1 wherein the second hard polishing pad has thereon a transparent window for thickness measurement.

7. The chemical mechanical polishing process according to claim 1 wherein the upper layer has a hardness of 40-50 (Shore D).

8. A chemical mechanical polishing process, comprising:
   providing a substrate having a bulk metal layer and a barrier layer;
   polishing the substrate with a first hard polishing pad on a first platen to substantially remove an upper portion of the bulk metal layer, wherein the first hard polishing pad has a hardness of above 50 (Shore D);
   polishing the substrate with a second hard polishing pad on a second platen to remove residual metal layer, thereby exposing the barrier layer, wherein the second hard polishing pad has a hardness of above 50 (Shore D); and
   polishing the substrate with a third hard polishing pad on a third platen to remove the barrier layer, wherein the third hard polishing pad has a hardness ranging between 40-50 (Shore D) and comprises an upper layer and a lower backing layer and said upper layer has a hardness less than 50 (Shore D).

9. The chemical mechanical polishing process according to claim 8 wherein the third hard polishing pad has a hardness ranging between 42.5-49.5 (Shore D).

10. The chemical mechanical polishing process according to claim 8 wherein the third hard polishing pad has a compressibility of about 0.5%-4.0%.

11. The chemical mechanical polishing process according to claim 8 wherein the chemical mechanical polishing process further comprising the following step:
    periodically rejuvenating a polishing surface of the third hard polishing pad using a conditioning system and condition chemicals.

12. The chemical mechanical polishing process according to claim 11 wherein the condition chemicals comprise triethanolamine, ethylene glycol, piperazine (C4H10N2), and citric acid.

13. The chemical mechanical polishing process according to claim 11 wherein the condition chemicals have a pH of about 9.0-11.0.

14. The chemical mechanical polishing process according to claim 8 wherein lifetime of the third hard polishing pad is monitored by a closed-loop control.

15. The chemical mechanical polishing process according to claim 14 wherein the closed-loop control is established by a thickness measurement system that connects to the third platen.

16. The chemical mechanical polishing process according to claim 8 wherein the third hard polishing pad has thereon a transparent window.

17. The chemical mechanical polishing process according to claim 8 wherein the upper layer has a hardness of 40-50 (Shore D).

18. A chemical mechanical polishing process, comprising:
    placing a substrate on a first hard polishing pad of a first platen, wherein the substrate has a bulk metal layer and a barrier layer;
    polishing the bulk metal layer by using the first hard polishing pad having a hardness of above 50 (Shore D) until the barrier layer is exposed;
    after removing the bulk metal layer, placing the substrate on a second hard polishing pad of a second platen, wherein the second hard polishing pad has a hardness ranging between 40-50 (Shore D) and comprises an upper layer and a lower backing layer and said upper layer has a hardness less than 50 (Shore D);
    dispersing alkaline condition chemicals onto the second hard polishing pad, the alkaline condition chemicals comprising triethanolamine, ethylene glycol, piperazine (C4H10N2), and citric acid; and
    polishing the barrier layer by using the second hard polishing pad.

19. The chemical mechanical polishing process according to claim 18 wherein the second hard polishing pad has a compressibility of about 0.5%-4.0%.

20. The chemical mechanical polishing process according to claim 18 wherein the chemical mechanical polishing process further comprising the following step:
    periodically rejuvenating a polishing surface of a third hard polishing pad using a conditioning diamond disk.

21. The chemical mechanical polishing process according to claim 18 wherein the alkaline condition chemical has a pH of about 9.0-11.0.

22. The chemical mechanical polishing process according to claim 18 wherein the second hard polishing pad has thereon a transparent window for thickness measurement.

23. The chemical mechanical polishing process according to claim 18 wherein the upper layer has a hardness of 40-50 (Shore D).

24. A chemical mechanical polishing process, comprising:
    providing a substrate having a bulk metal layer and a barrier layer;
    polishing the substrate with a first hard polishing pad on a first platen to substantially remove an upper portion of the bulk metal layer, wherein the first hard polishing pad has a hardness of above 50 (Shore D);

polishing the substrate with a second hard polishing pad on a second platen to remove residual metal layer, thereby exposing the barrier layer, wherein the second hard polishing pad has a hardness of above 50 (Shore D); and polishing the substrate with a third hard polishing pad on a third platen to remove the barrier layer, wherein the third hard polishing pad has a hardness ranging between 40-50 (Shore D) and comprises an upper layer and a lower backing layer and said upper layer has a hardness less than 50 (Shore D); and periodically rejuvenating a polishing surface of the third hard polishing pad using a conditioning system and condition chemicals comprising triethanolamine, ethylene glycol, piperazine, and citric acid.

25. The chemical mechanical polishing process according to claim 24 wherein the third hard polishing pad has a hardness ranging between 42.5-49.5 (Shore D).

26. The chemical mechanical polishing process according to claim 24 wherein the third hard polishing pad has a compressibility of about 0.5%-4.0%.

27. The chemical mechanical polishing process according to claim 24 wherein the condition chemicals have a pH of about 9.0-11.0.

28. The chemical mechanical polishing process according to claim 24 wherein lifetime of the third hard polishing pad is monitored by a closed-loop control.

29. The chemical mechanical polishing process according to claim 28 wherein the closed-loop control is established by a thickness measurement system that connects to the third platen.

30. The chemical mechanical polishing process according to claim 24 wherein the third hard polishing pad has thereon a transparent window.

31. The chemical mechanical polishing process according to claim 24 wherein the upper layer has a hardness of 40-50 (Shore D).

32. A chemical mechanical polishing process, comprising:
placing a substrate on a first hard polishing pad of a first platen, wherein the substrate has a bulk metal layer and a barrier layer;
polishing the bulk metal layer by using the first hard polishing pad having a hardness of above 50 (Shore D) until the barrier layer is exposed;
after removing the bulk metal layer, placing the substrate on a second hard polishing pad of a second platen, wherein the second hard polishing pad has a hardness ranging between 40-50 (Shore D);
dispersing an alkaline condition chemical onto the second hard polishing pad; and
polishing the barrier layer by using the second hard polishing pad.

33. The chemical mechanical polishing process according to claim 32 wherein the second hard polishing pad has a compressibility of about 0.5%-4.0%.

34. The chemical mechanical polishing process according to claim 32 wherein the chemical mechanical polishing process further comprising the following step:
periodically rejuvenating a polishing surface of a third hard polishing pad using a conditioning diamond disk.

35. The chemical mechanical polishing process according to claim 32 wherein the alkaline condition chemical comprise triethanolamine, ethylene glycol, piperazine (C4H10N2), and citric acid.

36. The chemical mechanical polishing process according to claim 32 wherein the alkaline condition chemical has a pH of about 9.0-11.0.

37. The chemical mechanical polishing process according to claim 32 wherein the second hard polishing pad has thereon a transparent window for thickness measurement.

38. The chemical mechanical polishing process according to claim 32 wherein the second hard polishing pad includes an upper layer and a lower backing layer.

39. The chemical mechanical polishing process according to claim 38 wherein the upper layer has a hardness of 40-50 (Shore D).

40. A chemical mechanical polishing process, comprising:
placing a substrate on a first hard polishing pad of a first platen, wherein the substrate has a bulk metal layer and a barrier layer;
polishing the bulk metal layer by using the first hard polishing pad having a hardness of above 50 (Shore D) until the barrier layer is exposed;
after removing the bulk metal layer, placing the substrate on a second hard polishing pad of a second platen, wherein the second hard polishing pad has a hardness ranging between 40-50 (Shore D);
dispersing alkaline condition chemicals onto the second hard polishing pad, the alkaline condition chemicals comprising triethanolamine, ethylene glycol, piperazine (C4H10N2), and citric acid; and
polishing the barrier layer by using the second hard polishing pad.

41. The chemical mechanical polishing process according to claim 40 wherein the second hard polishing pad has a compressibility of about 0.5%-4.0%.

42. The chemical mechanical polishing process according to claim 40 wherein the chemical mechanical polishing process further comprising the following step:
periodically rejuvenating a polishing surface of a third hard polishing pad using a conditioning diamond disk.

43. The chemical mechanical polishing process according to claim 40 wherein the alkaline condition chemical has a pH of about 9.0-11.0.

44. The chemical mechanical polishing process according to claim 40 wherein the second hard polishing pad has thereon a transparent window for thickness measurement.

45. The chemical mechanical polishing process according to claim 40 wherein the second hard polishing pad includes an upper layer and a lower backing layer.

46. The chemical mechanical polishing process according to claim 45 wherein the upper layer has a hardness of 40-50 (Shore D).

* * * * *